United States Patent [19]

Kenworthy et al.

[11] Patent Number: 4,584,216
[45] Date of Patent: Apr. 22, 1986

[54] PRECURED SPLIT HINGE FOR PHOTOMASK ASSEMBLY

[75] Inventors: James S. Kenworthy, Rockland; Victor Motyka, South Attleboro, both of Mass.; Robert G. Spindler, Plymouth, Minn.

[73] Assignee: PPG Industries, Inc., Pittsburgh, Pa.

[21] Appl. No.: 621,303

[22] Filed: Jun. 15, 1984

[51] Int. Cl.⁴ .................... B32B 17/06; B44F 1/06; G03B 27/04

[52] U.S. Cl. .................................. 428/38; 16/225; 16/DIG. 13; 156/99; 156/106; 428/101; 428/428; 428/429; 430/321

[58] Field of Search .................... 16/DIG. 13, 225; 156/99, 106; 430/321; 428/38, 101, 31, 428, 429

[56] References Cited

U.S. PATENT DOCUMENTS

| | | |
|---|---|---|
| 3,927,943 | 12/1975 | Pohl et al. ............................ 355/132 |
| 4,032,233 | 6/1977 | Oscarsson et al. ..................... 355/91 |
| 4,043,354 | 8/1977 | Brown ........................... 16/DIG. 13 |
| 4,144,066 | 3/1979 | Ernsberger ........................ 428/38 X |
| 4,147,380 | 4/1979 | Nelson .............................. 428/58 X |
| 4,155,735 | 5/1979 | Ernsberger ........................ 428/38 X |
| 4,183,554 | 1/1980 | Howard, Jr. ........................ 427/7 X |
| 4,412,739 | 11/1983 | Freiberg ................................. 355/89 |
| 4,446,184 | 5/1984 | Bowser .................................. 428/57 |
| 4,469,353 | 9/1984 | Anarwala ....................... 428/155 X |

FOREIGN PATENT DOCUMENTS

| | | |
|---|---|---|
| 17622 | 12/1955 | Fed. Rep. of Germany ........ 16/225 |
| 2439807 | 3/1976 | Fed. Rep. of Germany ........ 16/225 |

Primary Examiner—Henry F. Epstein
Attorney, Agent, or Firm—Donna L. Seidel

[57] ABSTRACT

Hinged glass photomask assemblies for photolithographic processes are disclosed wherein a flexible polymeric split hinge is used to join glass plates thereby providing for greater flexibility of the phototool.

20 Claims, 3 Drawing Figures

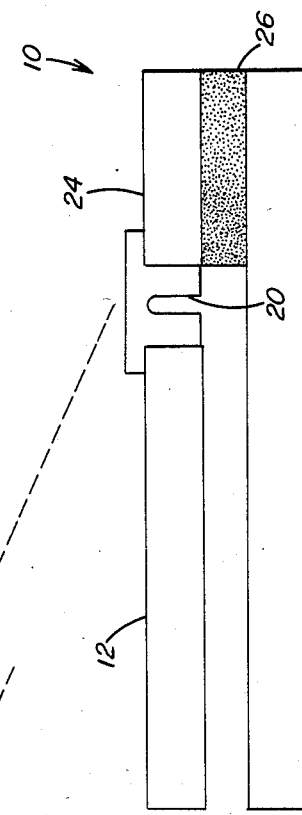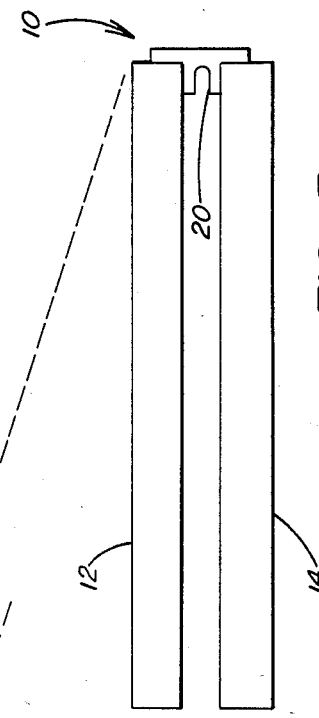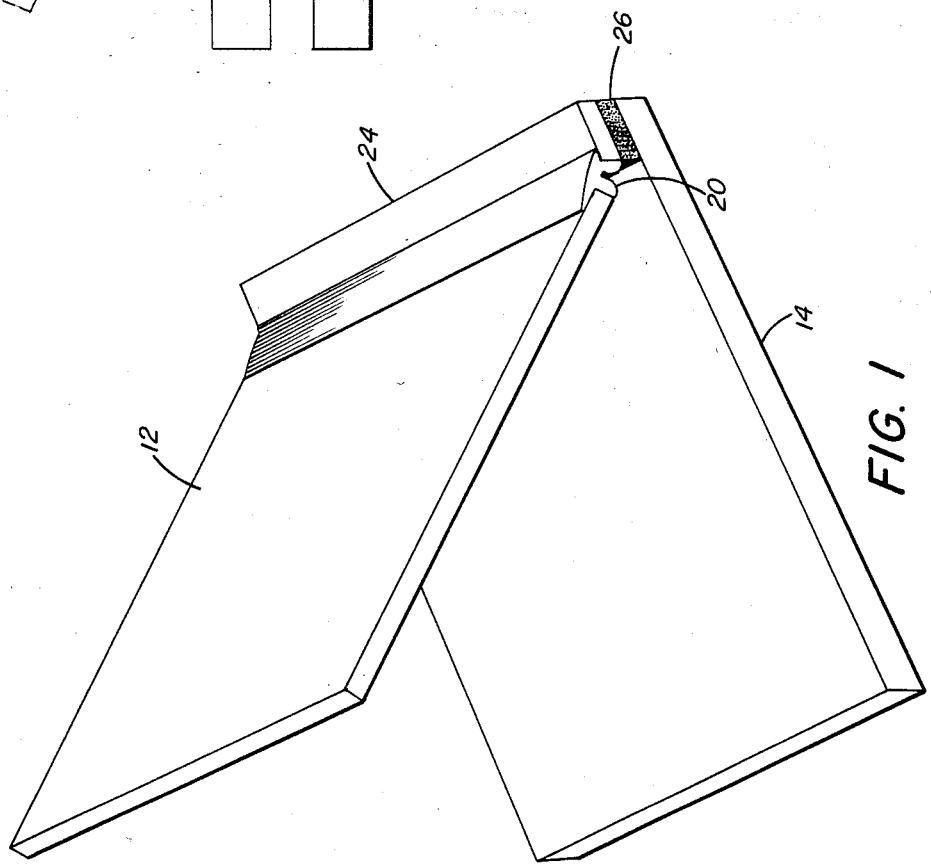

PRECURED SPLIT HINGE FOR PHOTOMASK ASSEMBLY

FIELD OF THE INVENTION

The present invention relates generally to the art of producing printed circuits and the like by photolithographic processes using photomasks, and relates more particularly to the art of facilitating repeated precise registration of a photomask assembly comprising a pair of glass plates.

DISCUSSION OF THE TECHNOLOGY

A printed circuit board comprises a substrate of insulator material and a circuit pattern of conductive material commonly formed by photolithographic processes. For example, a fiberglass board to be printed with circuitry is plated with copper and coated with a layer of photoresist material, a photosensitive polymer. The coated surface is then exposed to actinic radiation through a photomask master, a plate with some areas which are transparent to the actinic radiation and some areas which are not, to define the desired circuit pattern. The pattern is developed as a relief image in the photoresist by solvent treatment, the exposed and unexposed portions of the photosensitive polymer having different solubilities. The printed substrate may be either a positive or negative image of the photomask master depending on whether a positive or negative working photopolymer is used. Typically, the unexposed photoresist is removed and the underlying copper etched away to leave a pattern of conductive copper in the image of the transparent pattern on the photomask.

Photomasks currently used in photolithographic processes such as the manufacture of printed circuits are typically glass plates coated with photographic emulsion, iron oxide or chromium films having a pattern of transparent and opaque areas with respect to actinic radiation. The photomasks must be repeatedly aligned over the photoresist coated substrates to accurately reproduce the desired pattern. For this reason, durable but opaque films such as chromium may be less preferred than less durable films that are transparent with respect to visible light. The visually aligned assembly is exposed to actinic radiation which passes through the transparent areas of the photomask to photographically impose a pattern on the coated substrate, which is typically developed as a relief image by dissolution of the unexposed photosensitive material. In the alternative, the exposed coating material may be removed by dissolution, or either the exposed or unexposed areas may be chemically treated. The chemistry of photolithographic processes is well-known, and any one of the conventional routes is acceptable to arrive at a circuit pattern on the substrate.

For high volume production, more durable photomasks have been developed wherein the pattern is not a coating, but rather a stained image within a glass plate. These photomasks may be used many times in a photolithographic process to produce high resolution patterns. In many current applications, it is also useful to reduce the size of printed circuit boards by increasing the density of conductive lines, which requires increasing resolution, or by producing patterns on both sides of a substrate. Both increasing the resolution of a dense pattern and simultaneously printing both sides of a circuit board may be accomplished using a pair of glass photomasks registered on opposite sides of a Photoresist coated substrate. When both sides of photoresist coated substrates are to be printed simultaneously in a high volume commercial operation, a durable dual photomask assembly which can be repeatedly aligned quickly and accurately with minimum handling and risk of breakage of the glass plates is required.

A typical apparatus currently employed in the photolithographic imaging processes described above generally comprises a pair of frames defining an enclosed space which can be evacuated. A pair of flexible photolithographic masters may be visually aligned and then manually secured individually to the frame members by such devices as tape, clamps or spring clips. However, glass photomasks are typically registered using cylindrical alignment pins fitted through holes drilled through corresponding areas of the glass plates. A photopolymer coated substrate is then precisely registered between the photomasks. The assembly is subjected to vacuum and exposed to actinic radiation. When the substrate is removed from the assembly to develop the circuit pattern, the top glass plate must be lifted vertically and set aside until it is replaced over a fresh substrate. This process is costly, time-consuming and inaccurate, with the glass exposed to high risk of breakage. Therefore, improvements to the visual-manual registration technique have been sought.

For example, U.S. Pat. No. 4,032,233 to Oscarsson et al describes an apparatus which facilitates the registry of image bearing transparencies with a plate having photosensitive coating thereon. The registry apparatus includes upper and lower frames forming an enclosure in which the plates and transparencies are placed in sandwich relation. An outer gasket between the frames permits a vacuum to be applied to the enclosed space, while an inner perimeter channel permits a separate vacuum to hold the transparencies in place while the frames are opened to remove, insert or replace a plate.

U.S. Pat. No. 3,927,943 to Pohl et al discloses contact printing on opposite sides of a sensitized substrate by mounting first and second masks in first and second support members, adjusting the first support member to align the masks with respect to a common alignment pin, removing the second support member, mounting the substrate in a third support member, aligning the substrate with the first mask, forcing the substrate into contact with the first mask and magnetically holding it in place, removing the third support member, fastening the second support member to the first support member with the alignment pin, and drawing a vacuum between the masks to bring them into contact with opposite sides of the substrate.

U.S. Pat. No. 4,412,739 to Freiberg discloses an improved photomask assembly wherein two glass plates are joined by a flexible polymeric hinge, U.S. Pat. No. 4,446,184 to Bowser discloses combining a flexible polymeric hinge with a flexible but non-extensible binding strip attached to the glass plates to permit flexing of the hinge without lateral movement of the plates.

The present invention provides an improved photomask assembly which facilitates repeated precise registration while providing greater flexibility of the polymeric hinge.

DESCRIPTION OF THE DRAWING

The drawing illustrates a hinged photomask assembly 10 in accordance with the present invention.

FIG. 1 shows in perspective a hinged photomask assembly 10 wherein a pair of rigid plates 12 and 14 are joined by a flexible polymeric split hinge 20 which is attached to one of the plates 12 and to a separate hinge plate 24 which is affixed to the other plate 14 by a spacer 26.

FIG. 2 is a partial end view, enlarged to illustrate the cross-sectional shape of the split hinge material 20.

FIG. 3 is a partial end view of an alternate configuration wherein plates 12 and 14 are directly joined by flexible polymeric split hinge 20.

SUMMARY OF THE INVENTION

The present invention encompasses a method for making a hinged photomask assembly by joining two plates, at least one of which comprises a photomask image, by means of a flexible polymeric split hinge. The present invention further encompasses a hinged photomask assembly comprising two glass plates, at least one of which is a glass photomask, and a flexible split hinge.

DESCRIPTION OF THE PREFERRED EMBODIMENTS

The present invention provides for simple, efficient and accurate repeated use of a photomask assembly comprising a pair of glass plates joined by a durable, flexible polymeric hinge. Referring to FIG. 1, photomask assembly 10 of the present invention preferably includes a pair of glass plates 12 and 14, at least one of which comprises a photomask image (not shown), and a flexible polymeric split hinge 20, preferably T-shaped. The assembly preferably also comprises hinge plate 24, which is attached by spacer 26 to one of the glass plates 14 and bonded to the polymeric split hinge 20, which in turn is bonded to the other glass plate 12.

Two glass plates 12 and 14 are preferably joined by a flexible polymeric split hinge 20 to form a permanent photomask assembly as taught in U.S. Pat. No. 4,412,739 to Freiberg, the disclosure of which is incorporated herein by reference. In a preferred embodiment of the present invention, the polymeric split T-shaped hinge 20 comprises a silicone composition of the type taught in U.S. Pat. No. 4,446,184 to Bowser the disclosure of which is also incorporated herein by reference. However, in accordance with the present invention, the silicone hinge material is precured in the desired shape prior to use. The size of the plates is determined by the size of the substrates to be processed. In a preferred embodiment utilizing a hinge plate 24, plate 14 may be slightly larger than plate 12 to accommodate the hinge plate. In the alternative, if the plates are substantially equal in size, the overhang of plate 12 may be used as a handle to lift the plate.

In a preferred practice of the present invention, glass plates are cleaned, preferably with pumice and water. When the pumice is dry, the surfaces are wiped clean with a lint-free cloth or paper towel. A clean plate is preferably placed in a horizontal position on a supporting fixture. Preferably, a hinge plate, a narrow strip of pho glass about the same length as the glass plate, is placed on the supporting fixture separated from the glass plate by a spacer, such as a strip of polytetrafluoroethylene. A strip of precured, preshaped flexible polymeric hinge material is attached between the plates using a suitable adhesive preferably a room temperature curing adhesive. The hinge is preferably T-shaped in cross-section, and split along the base of the T for maximum flexibility. Preferably, this assembly is joined to a second glass plate by bonding the hinge plate to the second glass plate to form a permanent photomask assembly as shown in FIGS. 1 and 2. A preferred adhesive is a modified acrylic composition available from the Loctite Corporation as Loctite ® 352 SPEEDBONDER ™ which can be cured by exposure to ultraviolet radiation. Preferably, the polymeric hinge material is slightly compressed when bonding the hinge plate to the second glass plate in order to ensure precise positive engagement of any mechanical registration elements to align the pair of plates. A preferred registration system includes metal blocks and stops as disclosed in U.S. Pat. No. 4,445,775 to Tongel, the disclosure of which is incorporated herein by reference.

The photomask portion of the assembly may be a patterned coating of photographic emulsion, iron oxide or chromium on either or both of the glass plates, or any conventional photomask material. However, it is preferred that one or both of the glass plates bear a photomask image in the form of a stain pattern within the glass plate. A preferred photomask plate may be prepared by coating a glass plate with a photographic emulsion comprising a dispersion of silver halide in gelatin which is exposed to light through a master pattern. Exposed areas of the photographic emulsion form a latent image which is further developed by immersion in developing solutions which convert the silver halide to colloidal silver, while the unexposed emulsion is removed. The silver coated glass plate is subjected to conditions which cause migration of silver ions into the glass. While heat alone may be sufficient, preferably electron bombardment or an electric field is employed to minimize diffusion of the pattern. The silver ions are then reduced to elemental silver and agglomerated into colloidal microcrystalline color centers which form a stain pattern within the glass. The reduction and agglomeration of silver are preferably accomplished by heating in the presence of reducing ions, such as copper ions or the tin ions found in many glass compositions.

Most glass compositions are useful in accordance with the present invention with respect to the silicon hinge. In preferred embodiments wherein the glass plate comprises a photomask image in the form of an internal stain pattern, the glass composition requires mobile cations which migrate under the conditions imposed for migration of the silver ions, in order to provide sites for the silver ions within the glass. Typical soda-lime-silica glass compositions contain an abundant supply of mobile alkali metal ions, while typical float glass compositions contain, in addition to mobile alkali metal ions, tin ions which may be utilized to reduce the silver ions migrated into the glass from the photographic emulsion.

Photographic emulsions useful in accordance with preferred embodiments of the present invention are those which, upon exposure and development, produce a pattern containing silver with sufficient electrical conductivity to facilitate electromigration of silver ions into the glass in order to avoid the pattern diffusion associated with thermal migration. In addition, the photographic emulsion should itself have high resolving power in order to maximize the resolution of the pattern reproduced in the photomask plate. Detailed descriptions of methods for forming glass photomasks which are found in U.S. Pat. Nos. 4,144,066 and 4,155,735 to Ernsberger, the disclosures of which are incorporated herein by reference. In most preferred embodiments of the present invention, both glass plates are photomask plates.

Preferred flexible polymer hinge materials are silicones which can be precured and preshaped to the split T-shaped hinge configuration of the present invention and attached to glass plates with a suitable adhesive to form a very flexible hinge. The split T-shaped hinge configuration of the present invention permits repeated opening of the hinged photomask assembly to larger angles, e.g. 180°. The polymer must be sufficiently flexible and compressible in the cured state to accommodate variations in thickness of the substrates to be printed without stretching or loosening with repeated usage. Silicone materials useful in accordance with the present invention therefore must be flexible, but not deformative, in the cured state, and must be adherent to glass. Preferred silicone compositions in accordance with the present invention include phenyl-methyl-vinyl siloxane polymers, and preferably further include a curing agent and an adhesion promoter. A preferred curing agent is benzoyl peroxide and a preferred adhesion promoter is γ-glycidoxypropyltrimethoxysilane. The preferred silicone compositions typically cure at moderate temperatures in relatively short times to a Shore A hardness of about 25 to 70, preferably about 30 to 50. For example, about 300° F. (About 139° C.) for about 20 to 30 minutes.

The present invention will be further understood from the descriptions of specific examples which follow.

EXAMPLE I

Soda-lime-silica float glass plates are washed with pumice and water, dried and wiped clean with lint-free towels. A glass plate and a hinge plate are placed in a horizontal position on a supporting frame separated by a 0.03 by 0.125 inch (about 0.75 by 3.1 millimeters) TEFLON® polytetrafluoroethylene strip. A silicone extrusion product having a T-shape in cross-section, split through the base of the T, is attached to the glass plates with adhesive. The silicone composition comprises 100 parts by weight of a silicone rubber available as Silastic 1125 U from Dow Corning, 0.8 parts by weight of 50 percent benzoyl peroxide in silicone oil available as Cadox BS Paste from Nourly Chemical Corporation, and 1.0 part by weight of γ-glycidoxypropyltrimethoxysilane available as Z-6040 from Dow Corning. The hinged assembly is then affixed to a second glass plate by bonding the hinge plate to a second glass plate using a modified acrylic composition available from the Loctite Corporation as Loctite® 352 SPEEDBONDER™, which is cured by exposure to ultraviolet radiation.

EXAMPLE II

A hinged photomask assembly is produced as in Example I. The split, T-shaped polymeric hinge is formed from Dow Corning® Silastic® HS-30 silicone elastomer which is vulcanized by hot air during extrusion, and cured thereafter for 2 hours at 400° F. (about 204° C.). The precured, split T-shaped hinge is applied to the glass plates with Dow Corning® 999 silicone building and glazing sealant. The resultant hinged assembly may be repeatedly opened to 180° without stretching or loosening of the polymeric hinge. The split T-shape of the hinge significantly reduces stress on the bonded joints and permits greater flexibility of hinge. In addition, the use of room temperature curing adhesives allows repair of the hinge on site, if necessary.

The above examples are offered to illustrate the present invention which includes various modifications. For example, other silicone compositions as well as other polymeric hinge materials may be employed. These materials may be cured by means other than heat, and may be bonded to glass using primers if necessary, or other adhesives. As previously mentioned, the photomask may be in any known form, but is preferably a glass plate with a stained pattern. Other configurations, wherein the rigid plates are joined directly without using a hinge plate, may be produced. The scope of the present invention is defined by the following claims.

We claim:

1. In a method for making a hinged photomask assembly by joining two rigid plates, at least one of which comprises a photomask image, by means of a flexible polymeric material, the improvement which comprises:
   a. forming the polymeric material into a cured split hinge configuration; and
   b. attaching the cured polymeric split hinge to each of said two rigid plates by means of an adhesive.

2. The method according to claim 1, wherein the two rigid plates are glass.

3. The method according to claim 2, wherein the polymeric material is a silicone composition.

4. The method according to claim 3, wherein the silicone composition comprises phenyl-methyl-vinyl siloxane polymer.

5. The method according to claim 4, wherein the silicone composition further comprises a curing agent and an adhesion promoter.

6. The method according to claim 5, wherein the curing agent is benzoyl peroxide.

7. The method according to claim 6, wherein the adhesion promoter is γ-glycidoxypropyltrimethoxysilane.

8. The method according to claim 7, wherein the silicone composition is cured by heating at about 300° F. (about 139° C.) for about 20 to 30 minutes.

9. The method according to claim 8, wherein the cured silicone hinge has a Shore A hardness of about 25 to 70.

10. The method according to claim 3, wherein the silicone composition is attached to the glass plates with a room temperature curing adhesive.

11. A hinged photomask assembly comprising:
    a. first and second rigid plates, at least one of which comprises a photomask image; and
    b. hinge means comprising a precured flexible polymeric split hinge joining said frist and second rigid by means of an adhesive.

12. An article according to claim 11, wherein said first and second plates are glass.

13. An article according to claim 12, wherein at least one of said glass plates comprises a photomask image in the form of a stain pattern within said glass plates.

14. An article according to claim 12, wherein the flexible polymeric hinge is a cured silicone composition.

15. An article according to claim 11, wherein said plates are in parallel spaced facing relation and said hinge is attached along one pair of parallel adjacent edges of said plates perpendicular to the facing surfaces of said plates.

16. An article according to claim 11, wherein said plates are coplanar with adjacent edges in parallel spaced relation and said hinge is attached to adjacent parallel facing edge surface portions of the plates.

17. An article according to claim 16, wherein said first plate is a glass photomask and said second plate is a hinge plate which is affixed to a third plate in parallel spaced facing relation to said first and second plates.

18. An article according to claim 17, wherein said third plate is a glass photomask.

19. An article according to claim 18, wherein said polymeric hinge is a silicone composition.

20. An article according to claim 19, wherein said silicone hinge is attached to said glass plates using a room temperature curing adhesive.

* * * * *

UNITED STATES PATENT AND TRADEMARK OFFICE
CERTIFICATE OF CORRECTION

PATENT NO. : 4,584,216

DATED : April 22, 1986

INVENTOR(S) : Kenworthy et al.

It is certified that error appears in the above-identified patent and that said Letters Patent is hereby corrected as shown below:

Column 6, line 51, "frist" should read --first--.

Column 6, line 51, after "rigid" insert --plates--.

Signed and Sealed this

Fifth Day of August 1986

[SEAL]

Attest:

DONALD J. QUIGG

Attesting Officer

Commissioner of Patents and Trademarks